(12) United States Patent
Bock

(10) Patent No.: US 7,176,726 B2
(45) Date of Patent: Feb. 13, 2007

(54) INTEGRATED LOSS OF SIGNAL DETECTION WITH WIDE THRESHOLD RANGE AND PRECISE HYSTERESIS

(75) Inventor: Andreas Bock, Hemmingen (DE)

(73) Assignee: Texas Instruments Incorporated, Dallas, TX (US)

( * ) Notice: Subject to any disclaimer, the term of this patent is extended or adjusted under 35 U.S.C. 154(b) by 103 days.

(21) Appl. No.: 10/967,037

(22) Filed: Oct. 15, 2004

(65) Prior Publication Data
US 2005/0093582 A1     May 5, 2005

(30) Foreign Application Priority Data
Oct. 29, 2003  (DE)  .............................. 105 50 628

(51) Int. Cl.
G01R 19/00  (2006.01)
(52) U.S. Cl. .......................................... 327/18; 330/279
(58) Field of Classification Search .................. 327/18, 327/19, 20, 307; 330/254, 278, 279
See application file for complete search history.

(56) References Cited

U.S. PATENT DOCUMENTS

| | | | |
|---|---|---|---|
| 5,051,707 A * | 9/1991 | Fujita | 330/279 |
| 5,117,201 A * | 5/1992 | Luther | 330/279 |
| 5,955,925 A * | 9/1999 | Segawa et al. | 330/279 |
| 6,038,432 A * | 3/2000 | Onoda | 455/127.2 |
| 6,297,698 B1 * | 10/2001 | Callahan, Jr. | 330/254 |
| 6,489,803 B1 | 12/2002 | Steiner et al. | 326/31 |
| 6,661,287 B2 * | 12/2003 | Lin et al. | 330/254 |
| 6,804,501 B1 * | 10/2004 | Bradley et al. | 455/138 |
| 6,816,013 B2 * | 11/2004 | Kao | 330/279 |

\* cited by examiner

*Primary Examiner*—Linh My Nguyen
(74) *Attorney, Agent, or Firm*—Carlton H. Hoel; W. James Brady; Frederick J. Telecky, Jr.

(57) ABSTRACT

A loss-of-signal (LOS) detector includes a variable gain amplifier with an input receiving an input signal, a threshold comparator with a first input receiving a signal derived from an output of the variable gain amplifier, a second input receiving a reference level and an output providing a loss-of-signal indication signal. The variable gain amplifier has a gain control input receiving a gain control signal derived from the output of the threshold comparator and such that the gain of the variable gain amplifier is set to a lower value when the loss-of-signal indication signal is active, and set to a higher value when the loss-of-signal indication signal is not active. Accordingly, the LOS detector needs only one decision level for both of the LOS and NotLOS decisions, which is set in the linear range of the signal detector so that the hysteresis is reproduced precisely.

3 Claims, 4 Drawing Sheets

INTEGRATED LOSS OF SIGNAL DETECTION WITH WIDE THRESHOLD RANGE AND PRECISE HYSTERESIS

CROSS REFERENCE TO RELATED APPLICATIONS

This application claims priority under 35 USC § 119 of German Application Serial No. 103 50 628.4, filed Oct. 29, 2003.

FIELD OF THE INVENTION

The present invention relates to a loss-of-signal detector in an integrated signal processing circuit.

BACKGROUND OF THE INVENTION

Loss-of-signal (LOS) detection is a standard feature in integrated signal processing circuits. LOS detection is usually made with a signal detector by comparing the signal level to the level of a reference signal. To avoid chatter, the signal detector is provided with a hysteresis between the threshold level at which the signal is declared as lost, the assert threshold, and the threshold level at which the signal is declared as present, the deassert threshold. Implementing two different threshold levels results in demanding specifications mainly in terms of a linear operating range for the signal detection circuitry.

SUMMARY OF THE INVENTION

The present invention provides a loss-of-signal detector that can operate in a wide threshold range with a precise hysteresis even though the performance requirements of the signal detector are moderate.

Specifically the invention provides a loss-of-signal (LOS) detector that comprises a variable gain amplifier with an input receiving an input signal, a threshold comparator with a first input receiving a signal derived from an output of the variable gain amplifier, a second input receiving a reference level and an output providing a loss-of-signal indication signal. The variable gain amplifier has a gain control input receiving a gain control signal derived from the output of the threshold comparator and such that the gain of the variable gain amplifier is set to a lower value when the loss-of-signal indication signal is active, and set to a higher value when the loss-of-signal indication signal is not active. Accordingly, the LOS detector needs only one decision level for both of the LOS and NotLOS decisions, which is set in the linear range of the signal detector so that the hysteresis is reproduced precisely.

BRIEF DESCRIPTION OF THE DRAWINGS

Further advantages and features of the invention will become apparent from the following description with reference to the appending drawings. In the drawings.

DETAILED DESCRIPTION OF THE DRAWINGS

Figure 1:
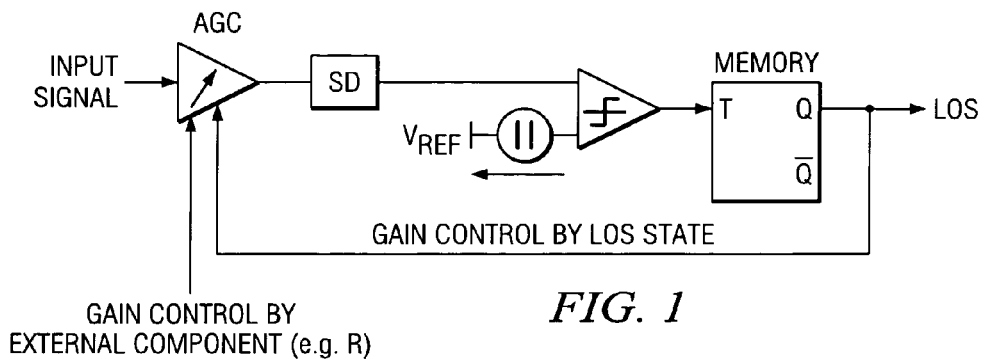
FIG. 1 is a schematic diagram showing the basic arrangement of a loss-of-signal detector.

With reference to FIG. 1, a loss-of-signal (LOS) detector comprises aa adjustable gain amplifier AGC with an input that receives an input signal. The output of amplifier AGC is connected to an input of a signal detector SD. A threshold comparator TC has a first input connected to an output of amplifier AGC and a second input connected to a reference signal source $V_{REF}$. Comparator TC has an output connected to a T-input of a memory circuit M. A Q-output of memory circuit M provides a loss-of-signal indication signal LOS. Amplifier AGC has a first gain control input connected to an external component and a second gain control input connected to the Q-output of memory circuit M.

In operation, the threshold comparator TC compares the output of signal detector SD with the reference level $V_{REF}$. The resulting output is latched in memory circuit M as LOS indication signal. The LOS indication signal is also used to switch the gain of amplifier AGC between a lower value and a higher value, as will be explained with reference to FIG. 2b. The loss-of-signal detector has only one decision level for both decisions, the assert decision and the deassert decision. Consequently, the demands on the performance of the signal detector can be relaxed, mainly in terms of linear operation range. Switching the gain of the amplifier AGC also results in a wider adjustable threshold range for the same basic gain during the LOS assert decision. Since the single decision level is places in a linear range of the signal detector's transfer function, a precise hysteresis is achieved. Finally, since only one comparator is needed, the required chip area is reduced, and power consumption is also reduced.

Figure 2A:
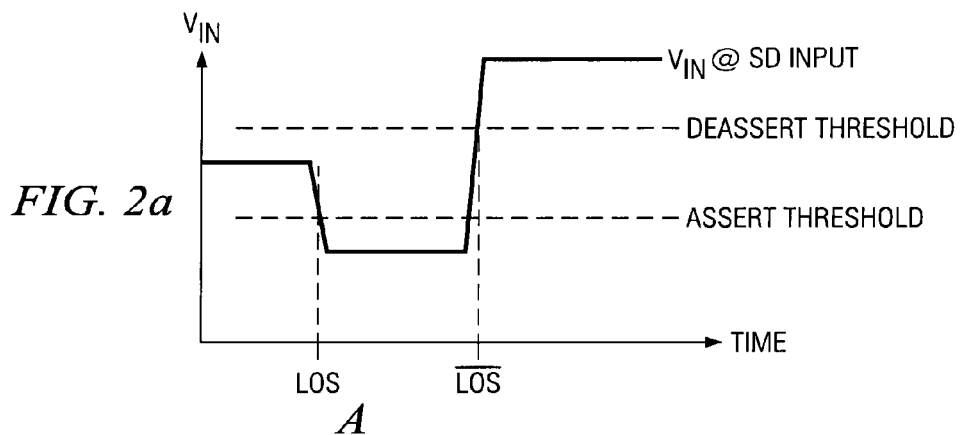
FIG. 2a is a signal diagram showing a conventional two-level loss-of-signal decision.

FIG. 2a shows the input signal of the signal detector as it is found in a common architecture (not switching the gain of the amplifier path). In order to provide a sufficient high amplitude to the input of the SD the signal has to be amplified first.

If variable amplifiers are used for this amplification, the voltage $V_{IN}$ @ SD input can be shifted relative to the assert and de-assert thresholds (adjustable threshold).

In FIG. 2a the input signal starts with a level above the assert threshold, then falling below this assert threshold and finally rising above a second, higher threshold, the deassert threshold.

When the signal amplitude drops below the assert threshold the LOS (loss of signal) state will be indicated. In order to avoid chatter at the LOS output, this state is not set back until a threshold level higher than the assert level is regained. This is the deassert level. The ratio between deassert and assert level is proposed/defined as the hysteresis.

Figure 2B:
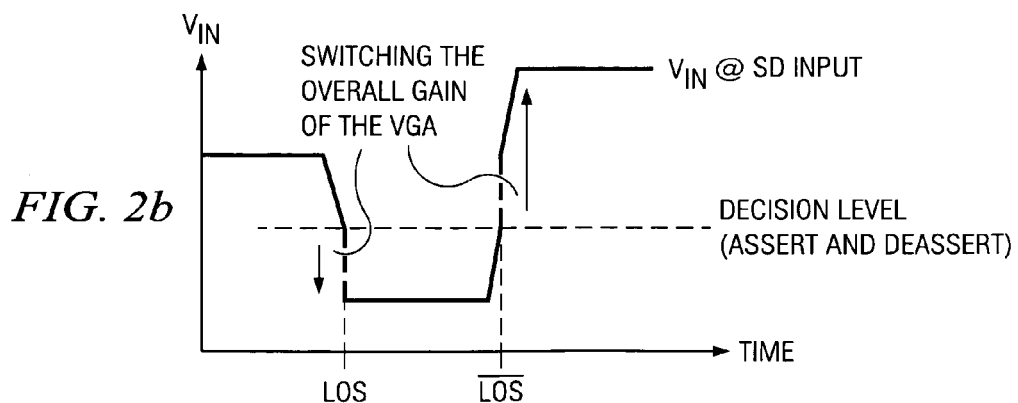
FIG. 2b is a signal diagram showing a one-level loss-of-signal decision according to the invention.

FIG. 2b shows the same scenario for the new architecture (with switching the overall gain of the VGAs). When the signal drops below the decision level (assert detection state), the LOS state will be indicated and the gain of the amplifier/s (here VGA) will be reduced by the amount of the desired hysteresis. Thus the signal now has to regain a higher amplitude (deassert) to surpass the decision level again (deassert detection state). The state is then switched back to assert detection. That means, that not LOS will be indicated and that the gain of the amplifier/s is increased again.

Demands on the Signal Detector SD

In general there are two concepts to detect signal amplitudes. First is to use a peak detector. The slope of the signal is tracked and the highest value is held. For lower data rates and/or longer sequences of consecutive ones or zeros a large capacitor has to be used to hold that peak value information. This demand conflicts with the detection of high data rates and high edge densities, because the large capacitor than has to be charged in a very short time. Thus this concept is not suitable for broadband applications.

The second approach is to use a rectifier followed by a low-pass filter. An example of a rectifier suitable for low supply voltage operation and high data rates is shown in FIG. 4. The major disadvantage of the rectifier is its non ideal transfer function as it is shown in FIG. 3a below.

Figure 3A:
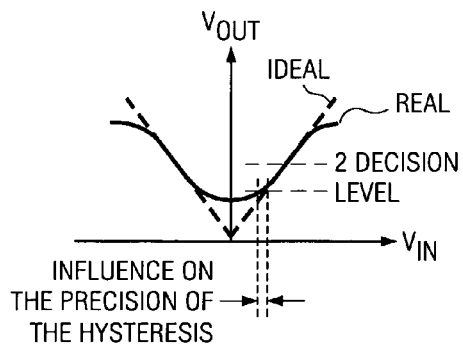
FIG. 3a shows a transfer function of a rectifier in a signal detector with two decision levels.
Figure 3B:
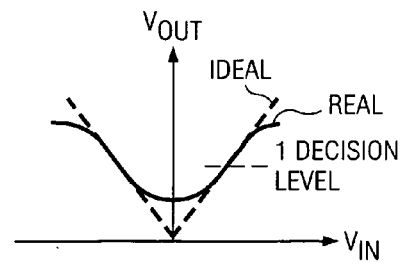
FIG. 3b shows a transfer function of a rectifier in a signal detector with only one decision level.
Figure 4:
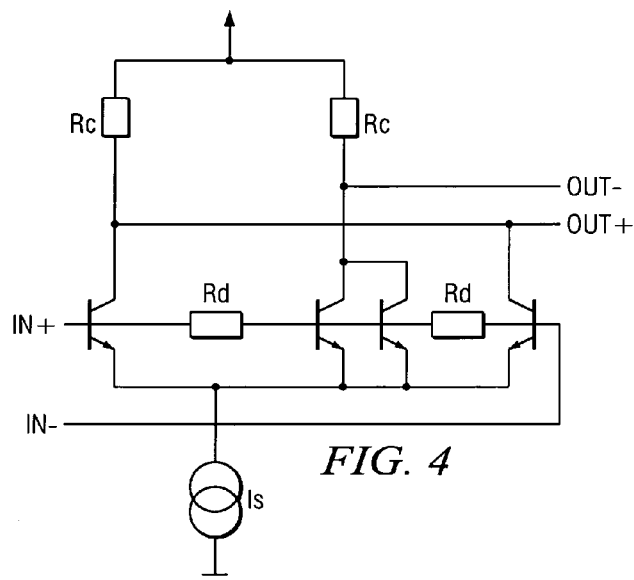
FIG. 4 is a schematic circuit diagram of a rectifier in a signal detector for high data rates and low supply voltage operation.

This is because the deviation from the ideal linear transfer function will influence the hysteresis, as indicated in FIG. 3a. The non-linearity itself is temperature and process dependent. It can easily be seen in FIG. 3b, that the new topology presented in this patent overcomes this problem due to utilizing only one decision level.

Figure 5:
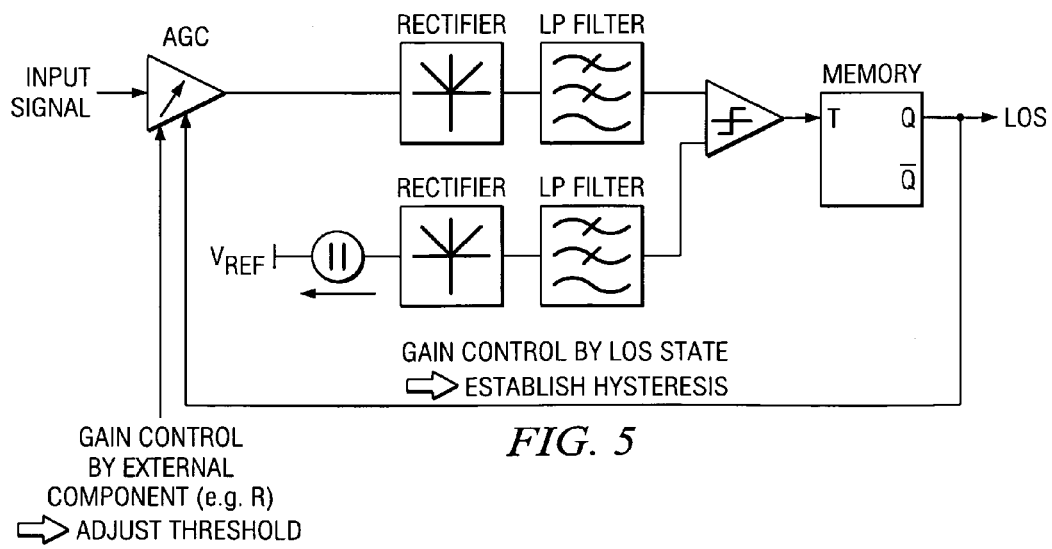
FIG. 5 is a schematic circuit diagram of an embodiment of the loss-of-signal detector.
Figure 6:
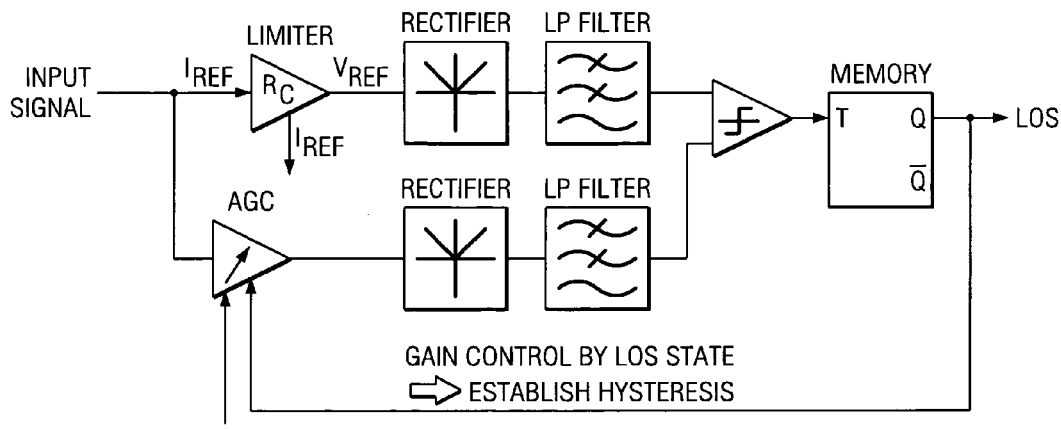
FIG. 6 is a schematic circuit diagram of a preferred embodiment of the loss-of-signal detector.

FIG. 5 shows another improvement of the topology. If a rectifier is also inserted in the path of the reference voltage, the temperature and process variance of the rectifier will also influence the reference voltage by the same amount as the input signal (signal to be detected). The final implementation of the integrated LOS detection circuitry can be found in FIG. 6. By utilizing an alternating reference voltage, the influence of the rectifier in the time domain is compensated as well (pattern independency).

Figure 7:
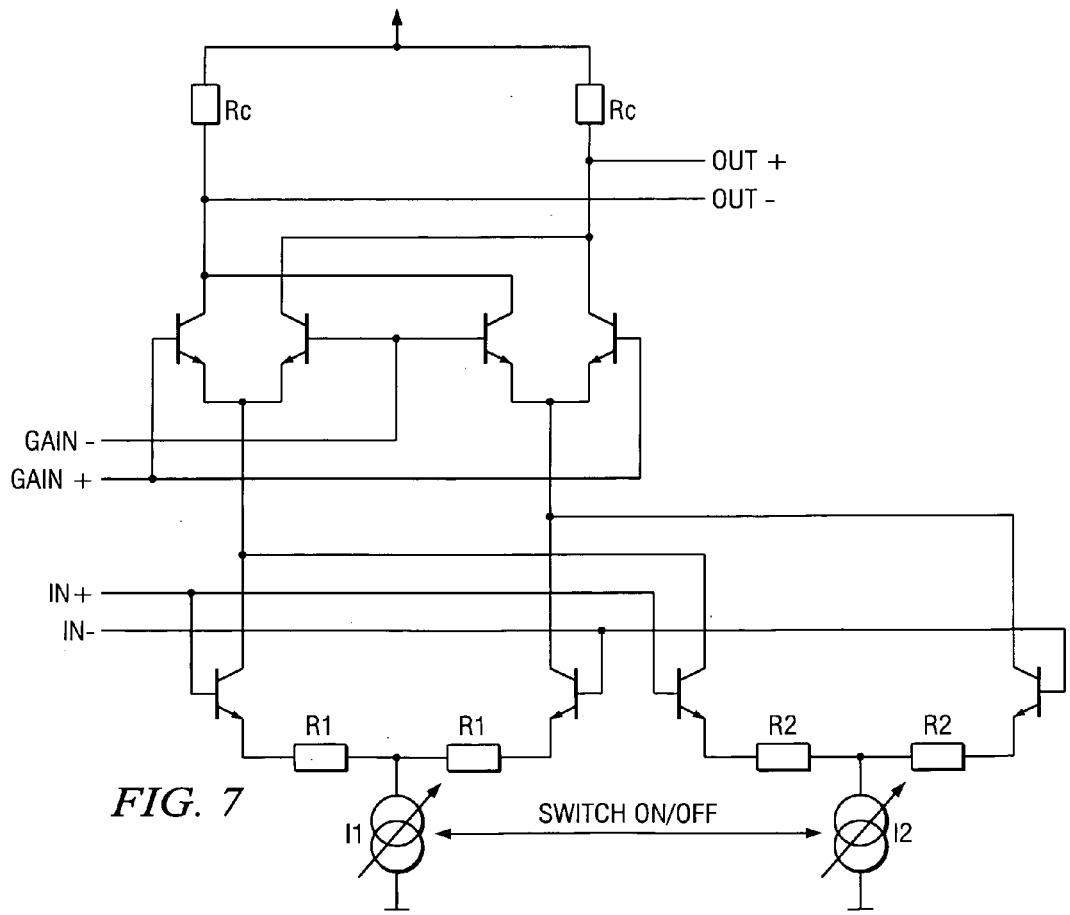
FIG. 7 is a circuit diagram of a switched gain amplifier used in the preferred embodiment of the loss-of-signal detector.
Figure 8A:
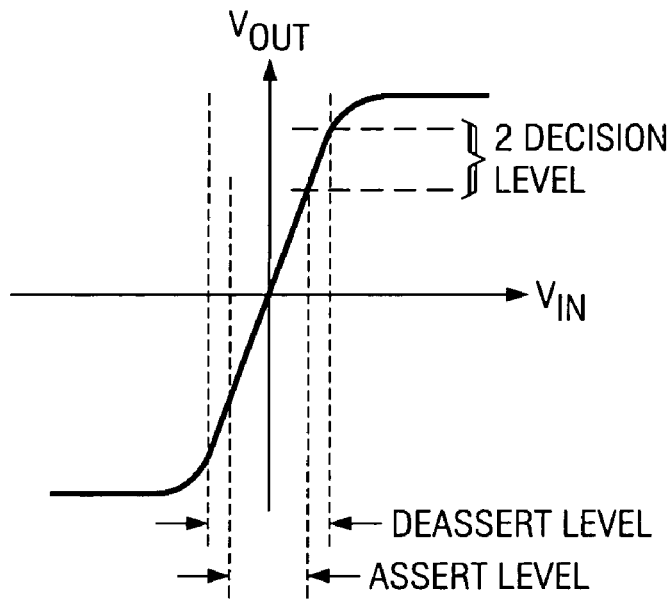
FIG. 8a is a diagram showing the transfer function of an emitter degenerated differential amplifier with a fixed emitter degeneration.

The transfer function of an emitter degenerated differential amplifier is depicted in FIG. 8a. The range of linear transfer is determined by the emitter degeneration (e.g. R1, R2 in FIG. 7). For the following consideration it does not matter, if the amplifier has a fixed gain or an adjusted gain (VGA). As already described above, the common VGA-approach only allows to adjust the signal relative to the reference voltage (threshold adjust). It does not change the range of linear operation. Thus both the assert level as well as the deassert level have to be in the range of linear operation as shown in FIG. 8a.

Figure 8B:
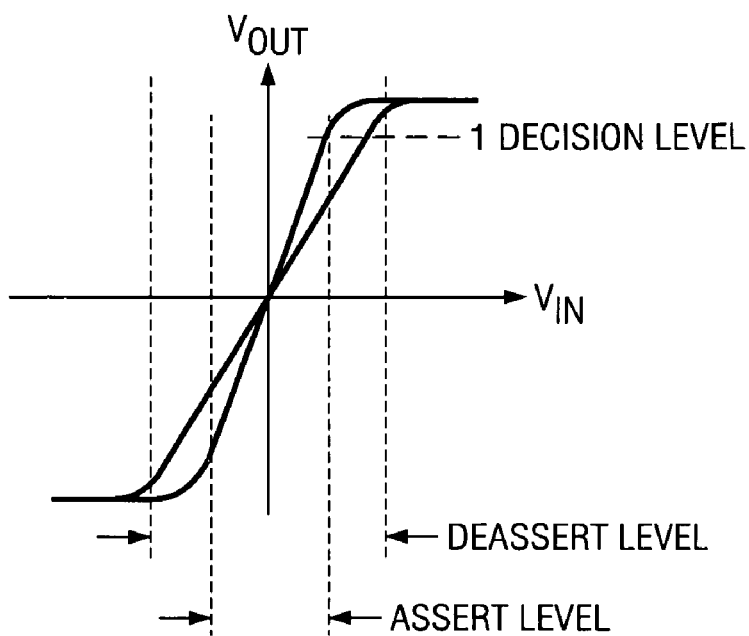
FIG. 8b is a diagram showing the transfer function of an emitter degenerated differential amplifier with a switched emitter degeneration for use in the inventive loss-of-signal detector.

This is different for the proposed approach of an additional overall gain switch. Switching the overall gain by changing the emitter degeneration allows to perfectly adapt the linear range of operation to the assert and deassert levels (FIG. 8b). Thus for the same basic gain during assert level detection (⇒ same accuracy), a wider threshold range can be used. This is because the whole linear range can be used for the assert detection in the 'basic' gain setting. For the deassert detection the gain is reduced and the linear range increased.

The invention claimed is:

1. A loss-of-signal detector, comprising:
(a) an amplifier with a high gain state and a low gain state;
(b) a comparator coupled to an output of said amplifier and to a source of a reference signal, an output of said comparator for indication of a loss-of-signal at an input of said amplifier;
(c) a rectifier and a low-pass filter coupled between said comparator and said output of said amplifier; and
(d) a gain control coupled from the output of said comparator to said amplifier;
(e) wherein (i) when said amplifier is in said high gain state and a signal at said output of said amplifier falls below said reference signal, said gain control switches said amplifier into said low gain state and (ii) when said amplifier is in said low gain state and a signal at said output of said amplifier rises above said reference signal, said gain control switches said amplifier into said high gain state.

2. A loss-of-signal detector, comprising:
(a) an amplifier with a high gain state and a low gain state;
(b) a comparator coupled to the output of said amplifier and to a source of a reference signal, an output of said comparator for indication of a loss-of-signal at an input of said amplifier;
(c) a rectifier and a low-pass filter coupled between said comparator and said source of a reference signal; and
(d) a gain control coupled from the output of said comparator to said amplifier;
(e) wherein (i) when said amplifier is in said high gain state and a signal at said output of said amplifier falls below said reference signal, said gain control switches said amplifier into said low gain state and (ii) when said amplifier is in said low gain state and a signal at said output of said amplifier rises above said reference signal, said gain control switches said amplifier into said high gain state.

3. A loss-of-signal detector, comprising:
(a) an amplifier with a high gain state and a low gain state;
(b) a comparator coupled to an output of said amplifier and to a source of a reference signal, the output of said comparator for indication of a loss-of-signal at an input of said amplifier;
(c) a gain control coupled from the output of said comparator to said amplifier;
(d) wherein (i) when said amplifier is in said high gain state and a signal at said output of said amplifier falls below said reference signal, said gain control switches said amplifier into said low gain state and (ii) when said amplifier is in said low gain state and a signal at said output of said amplifier rises above said reference signal, said gain control switches said amplifier into said high gain state; and
(e) wherein said amplifier includes a differential amplifier with emitter-coupled bipolar transistor pairs and degeneration of the emitter-coupled transistor pairs is increased to reduce the gain of said amplifier.

* * * * *

UNITED STATES PATENT AND TRADEMARK OFFICE
CERTIFICATE OF CORRECTION

| | | |
|---|---|---|
| PATENT NO. | : 7,176,726 B2 | Page 1 of 1 |
| APPLICATION NO. | : 10/967037 | |
| DATED | : February 13, 2007 | |
| INVENTOR(S) | : Andreas Bock | |

It is certified that error appears in the above-identified patent and that said Letters Patent is hereby corrected as shown below:

Title Page
(30) Foreign Application Priority Data: "105 50 628" should be changed to
--103 50 628--

Signed and Sealed this

Seventeenth Day of April, 2007

JON W. DUDAS
*Director of the United States Patent and Trademark Office*